US006057219A

United States Patent [19]
Cho et al.

[11] Patent Number: 6,057,219
[45] Date of Patent: May 2, 2000

[54] METHOD OF FORMING AN OHMIC CONTACT TO A III-V SEMICONDUCTOR MATERIAL

[75] Inventors: Jaeshin Cho, Chandler; Gregory L. Hansell, Tempe; Naresh Saha, Chandler, all of Ariz.

[73] Assignee: Motorola, Inc., Schaumburg, Ill.

[21] Appl. No.: 08/270,082

[22] Filed: Jul. 1, 1994

[51] Int. Cl.[7] .................................................. H01L 21/44
[52] U.S. Cl. ......................... 438/597; 438/604; 438/571; 438/576; 438/606
[58] Field of Search ................................. 437/184, 235; 156/643; 438/597, 598, 599, 604, 571, 576, 606

[56] References Cited

U.S. PATENT DOCUMENTS

| | | |
|---|---|---|
| 4,745,082 | 5/1988 | Kwok . |
| 5,010,039 | 4/1991 | Ku et al. .................................. 437/235 |
| 5,144,410 | 9/1992 | Johnson ..................................... 357/63 |

FOREIGN PATENT DOCUMENTS

| | | | |
|---|---|---|---|
| 58-168234 | 10/1983 | Japan ..................................... 437/184 |
| 1209726 | 8/1989 | Japan ..................................... 437/184 |
| 311628 | 1/1991 | Japan ..................................... 437/184 |

OTHER PUBLICATIONS

R Piato et al. "Reactive Ion Etching in $SF_6$ Gas Mixtures" J. Electro. Soc. Jan. 1987, vol. 134 #1, pp. 165–175.
H. Oigawa et al., "Stabilization of GaAs Surface/Interface by Sulfur Treatment", SSDM, 1988, pp. 263–266.
E. Yablonovitch et al., "Nearly Ideal Electronic Properties of Sulfide Coated GaAs Surfaces", Applied Physics Letter 51(6), Aug. 1987, pp. 439–441.
M.S. Carpenter et al., "Schottky Barrier Formation on $(NH_4)_2S$–Treated n– and p–type (100)GaAs", Applied Physics Letter 53(1), Jul. 1988, pp. 66–68.
D. Liu et al., "Deep Level Transient Spectroscopy Study of GaAs Surface States Treated with Inorganic Sulfides", Applied Physics Letter 53(12), Sep. 1988, pp. 1059–1061.
B.A. Cowans et al., "X–ray Photoelectron Spectroscopy of Ammonium Sulfide Treated GaAs (100) Surfaces", Applied Physics Letter 54(4), Jan. 1989, pp. 365–367.
D. J. Spindt et al., "Photoemission Study of the Band Bending and Chemistry of Sodium Sulfide on GaAs (100)", Applied Physics Letter 54(12), Mar. 1989, pp. 1148–1150.
M.S. Carpenter et al., "Investigations of Ammonium Sulfide Surface Treatments on GaAs", J. Vac. Sci. Technol. B7(4), Jul./Aug. 1989, pp. 845–850.
W.E. Spicer et al., "Pinning and Fermi Level Movement at GaAs Surfaces and Interfaces", J. Vac. Sci. Technol. A8(3), May/Jun. 1990, pp. 2084–2089.
J. Shin et al., "Sulfur Bonding to GaAs", J. Vac. Sci. Technol. B9(4), Jul./Aug. 1991, pp. 2337–2341.
H. Sugahara et al., "Synchrotron Radiation Photoemission Analysis for $(NH_4)_2S_x$–treated GaAs", J. Appl. Phys. 69(8), Apr. 1991, pp. 4349–4353.
H. Kawanishi et al., "Adsorption and Desorption of Sulfur on a GaAs (001) Surface by $H_2S$ Exposure and Heat treatment", J. Vac. Sci. Technol. B9(3), May/Jun. 1991, pp. 1535–1539.

(List continued on next page.)

*Primary Examiner*—John F. Niebling
*Assistant Examiner*—Lynne A. Gurley
*Attorney, Agent, or Firm*—Miriam Jackson; Rennie William Dover

[57] ABSTRACT

An ohmic contact to a III–V semiconductor material is fabricated by dry etching a silicon nitride layer overlying the III–V semiconductor material with a chemical comprised of a group VI element. An ohmic metal layer is formed on the III–V semiconductor material after the silicon nitride layer is etched and before any exposure of the III–V semiconductor material to a chemical which etches the III–V semiconductor material or removes the group VI element.

15 Claims, 1 Drawing Sheet

OTHER PUBLICATIONS

H. Kawanishi et al., "Reaction of Oxygen with in Situ $H_2S$–treated GaAs (001) Surfaces", J. Appl. Phys. 70(2), Jul. 1991, pp. 805–810.

C. Wan et al., "Comparison of Self–Aligned and Non–Self-Aligned GaAs E/D MESFET's", 1989, pp. 839–845.

C.F. Wan et al., A Comparison Study of GaAs E/D–MESFETs Fabricated with Self–Aligned and Non–Self–Aligned Processes, IEEE, 1997, pp. 133–136.

M. Ino et al., "A 1.2 NS GaAs Read–Only–Memory Fabricated by 0.5 mm–Gate BP–Saint", IEEE. 1987, pp. 189–192.

J. Cho et al., "Doping of GaAs Using $SF_6$ Plasma Treatment", J. Appl. Phys. 74(12), Dec. 1993, pp. 7315–7320.

K. Wakamoto et al., "A True Off–Site Self–Aligned Process for High Efficiency Ku–Band Power Fets", IEEE, 1989, pp. 1023–1026.

T. Tambo et al., "Low–Noise GaAs MESFET by Dummy–Gate Self Alignment Technology for MMIC", IEEE, 1987, pp. 49–52.

Y.D. Shen et al., An Ultra High Performance Manufacturable GaAs E/D Process, IEEE, 1987, pp. 125–128.

J. Kleks et al., "A 4–Bit Single Chip Analog to Digital Converter with a 1.0 Gigahertz Analog Input Bandwidth", IEEE, 1987, pp. 79–82.

N. Matsunaga et al., "Gallium Arsendide Mesfet Technologies with 0.7 mm Gate–Length for 4kb 1nd Static Ram", IEEE, 1987, p. 129–132.

T. Enoki et al., "0.3–mm Advanced Saint FET's Having Asymmetric $n^+$–Layers for Ultra–High Frequency GaAs MMIC's", IEEE, 1988, pp. 18–24.

S. Susa, "Comparisons of GaAs, Tungsten, and Photoresist Etch Rates and GaAs Surfaces Using RIE with $CF_4$, $CF_4$+$N_2$, and $SF_6$+$N_2$ Mixtures", J Electrochem. Co.: Solid–State Science and Technology, Nov. 1985, vol. 32, No. 11, pp. 2762–2767.

R. Pinto et al., "Reactive Ion Etching in SF6 Gas Mixtures", J. Electrochem Soc.: Solid–State Science and Technology, Jan. 1987, vol. 134, No. 1, pp. 165–175.

P. O'Neil et al., "Motorola Readies Low Cost GaAs Process for Commercialization", No Date.

K. Yamasaki et al., "GaAs LSI–Directed MESFET's with Self–Aligned Implantation for $n^+$–Layer Technology (SAINT)", IEEE, 1982, pp. 1772–1777.

R. Vantuyl et al., "A Manufacturing Process for Analog and Digital Gallium Arsenide Integrated Circuits", IEEE, 1982, pp. 1031–1038.

K. Ueno et al., "A High Transconductance GaAs MESFET with Reduced Short Channel Effect Characteristics", IEEE, 1985, pp. 82–85.

K. Yamasaki et al., "Self–Align Implantation for n+–Layer Technology (SAINT) for High–Speed GaAs ICs", Electronics Letters, Feb. 1982, pp. 119–121.

6,057,219

METHOD OF FORMING AN OHMIC CONTACT TO A III–V SEMICONDUCTOR MATERIAL

BACKGROUND OF THE INVENTION

This invention relates to, in general, III–V semiconductor devices, and more particularly, a method of forming a ohmic contact to a III–V semiconductor material.

A low resistance contact to III–V semiconductor materials is important as semiconductor device dimensions shrink both vertically and laterally. As the metal to semiconductor contact area is scaled, the contact resistance between the ohmic metal and the source and drain regions increases, which may significantly degrade device performance. The specific contact resistivity of the ohmic contacts required in the integrated circuit technology is typically in the $10^{-6}$ to $10^{-8}$ ohm-cm$^2$ range, and the contact property should be maintained throughout all device fabrication steps and throughout device operation.

It would be advantageous to have a low cost, effective method to fabricate low resistance contacts to III–V semiconductor materials.

DETAILED DESCRIPTION OF THE DRAWINGS

Figure 1:
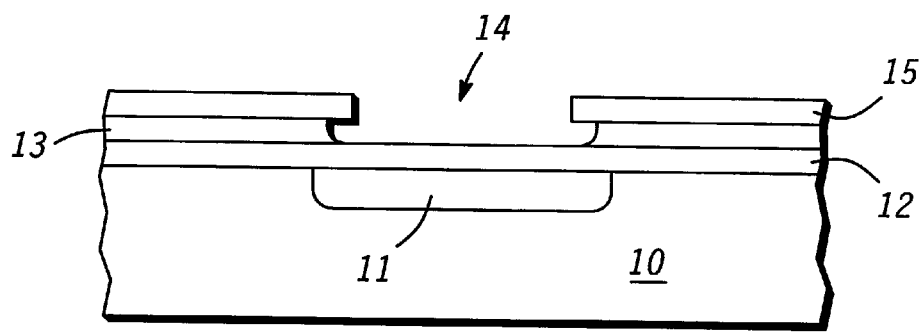
FIG. 1 illustrates an enlarged, cross-sectional view of an embodiment of the present invention during an intermediate stage of fabrication.

FIG. 1 illustrates an enlarged, cross-sectional view of a portion of an embodiment of the present invention in an intermediate stage of fabrication. A III–V semiconductor substrate 10 is provided having a doped region 11 formed in a portion thereof. Doped region 11 acts as the source or drain region of a semiconductor device built in III–V semiconductor material 10. In a preferred embodiments III–V semiconductor material 10 is comprised of gallium arsenide.

A silicon nitride (SiN$_x$) layer 12 is formed on a surface of III–V semiconductor material 10. In a preferred embodiment, the thickness of silicon nitride layer 12 is 250–750 Angstroms. Subsequently, a dielectric layer 13 comprised of silicon oxynitride or silicon dioxide is formed over silicon nitride layer 12. A masking layer 15 is formed and patterned over dielectric layer 13 to form an opening 14 therein. Masking layer 15 is used as a mask during a wet etch process of dielectric layer 13. It is important that a wet etch process be used to form opening 14 in dielectric layer 13 so that dielectric layer 13 is undercut slightly from the edge of masking layer 15. A suitable wet etch solution is comprised of hydrofluoric acid, in particular, a buffered hydrofluoric acid. It is also important not to etch or erode underlying silicon nitride layer 12 during the etching of dielectric layer 13, as will be further discussed below.

Because it is important to undercut dielectric layer 13, a dry etch utilizing fluorocarbon plasmas, such as $C_2F_6$, $CHF_3$, and $CF_4$, can not be used because they are anisotropic. In addition, fluorocarbon plasmas do not have the selectivity to stop etching on silicon nitride layer 12. Therefore, if a fluorocarbon based dry etch is used, underlying silicon nitride layer 12 would be etched, and the surface of III–V semiconductor material 10 would be exposed to the reactive ions. This creates reactive ion induced damage to the surface of III–V semiconductor material 10, which ultimately results in poor electrical characteristics of the semiconductor device. Thus, it is desirable that silicon nitride layer 12 not be substantially etched when dielectric layer 13 is etched.

Isotropic dry etch (to obtain an undercut) of dielectric layer 13 can not be performed because a high etch rate selectivity between dielectric layer 13 and silicon nitride layer 12 cannot be achieved. For example, a dry etch comprised of nitrogen fluoride (NF$_3$) would etch silicon nitride layer 12 at a faster rate than dielectric layer 13. Because it is preferred that silicon nitride layer 12 be of a thickness of 250–750 Angstroms, it is not manufacturably feasible to stop etching on silicon nitride layer 12 during the isotropic dry etch of dielectric layer 13. Additionally, etching of silicon nitride layer 12 using NF$_3$ is undesirable because silicon nitride layer 12 must be etched using a chemical comprised of a group VI element, as will be further discussed below.

Figure 2:
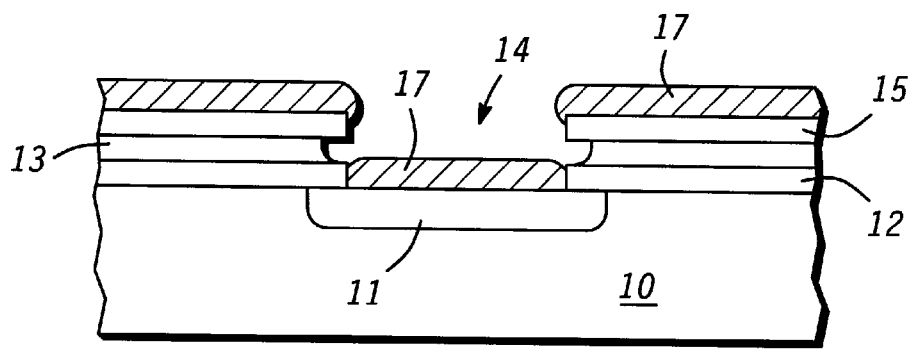
FIG. 2 illustrates an enlarged, cross-sectional view of an embodiment of the present invention in a later stage of fabrication.

FIG. 2 illustrates the structure of FIG. 1 further along in processing. After dielectric layer 13 has been etched in opening 14, a chemical comprised of a group VI element is used to dry etch a portion of silicon nitride layer 12 in opening 14. Any group VI element would be suitable for this step, however, selenium and tellurium containing gases are not commercially available at the present time. At the present time, the only suitable plasma chemistry available is sulfur hexafluoride (SF$_6$). In a preferred embodiment, an SF$_6$ plasma with a power of 140 watts is used to obtain an etch rate of approximately 2000 Angstroms/min. It is important to overetch silicon nitride layer 12 so that it is completely removed over doped region 11. For example, if silicon nitride layer 12 is of a thickness of 500 Angstroms, then silicon nitride layer 12 is preferably etched for at least one minute. The use of SF$_6$ provides a low power plasma etch process to etch silicon nitride layer 12 without damaging the surface of III–V semiconductor material 10.

After dry etching of silicon nitride layer 12 using the chemical comprised of a group VI element, an ohmic metal layer 17 is deposited on the surface of the structure of FIG. 2. In a preferred embodiment, ohmic metal layer 17 is not comprised of gold. Gold is undesirable because of poor thermal stability of the contact resistance. Ohmic metal layer 17 may be comprised of metal layers such as nickel-germanium-tungsten, germanium-molybdenum-tungsten, germanium-indium-tungsten, nickel-indium-tungsten, nickel-silicon-tungsten, palladium-indium-germanium, palladium-germanium, palladium-silicon, and germanium-nickel-tungsten, among other non-gold containing metallization systems.

In the embodiment shown, a lift-off process is used to form ohmic metal layer 17. It is important to note that, in this embodiment, undercutting of dielectric layer 13 from the edge of masking layer 15 enables the formation of a discontinuous ohmic metal layer 17 on the surface of III–V semiconductor material 10 and on the surface of masking layer 15.

It is critical that deposition of ohmic metal layer 17 take place after etching of silicon nitride layer 12 with a chemical comprised of a group VI element and before exposure of the surface of III–V semiconductor material 10 to any other processing step which would etch III–V semiconductor material 10 or remove a group VI element. The dry etching of silicon nitride layer 12 with a chemical comprised of a group VI element leaves a group VI element at or near the surface of III–V semiconductor material 10 where an ohmic contact is formed. It is believed that a group VI element present on or near the surface of III–V semiconductor material provides necessary n-type dopant at the III–V semiconductor material 10 and ohmic metal layer 17 interface, thereby lowering the contact resistance.

It is also important to note that no surface treatment of III–V semiconductor material 10 is necessary if ohmic metal 17 is deposited after dry etching of silicon nitride layer 12 with a chemical comprised of a group VI element without exposure of the surface of III–V semiconductor material 10 to any other processing step which would etch III–V semiconductor material 10 or remove a group VI element. A reduction in cost and cycle time is achieved by not having to separately treat the surface of III–V semiconductor material 10 with a chemical comprised of a group VI element, as has been done in the past.

For example, a wet etch step (or clean) performed in the past just prior to deposition of ohmic metal 17 to remove III–V native oxide and contaminants from the surface of III–V semiconductor material 10 cannot be performed in this invention. This step is contrary to what has been done in the past. In the past, it was believed that this wet etch had to be performed in order to obtain good ohmic contacts. In the present invention, it was discovered that this etch performed to remove III–V native oxide and contaminants would also remove any of the group VI element which remains on the surface or near the surface of III–V semiconductor material 10. The removal of the group VI element would result in an order of magnitude higher contact resistance.

Thus, by not subjecting the surface of III–V semiconductor material 10 to any other chemicals which remove a group VI element or etch the III–V semiconductor material 10 prior to deposition of ohmic metal 17, no additional conditioning or treatment (exposure to a chemical comprised of a group VI element) of III–V semiconductor material 10 with a group VI element is necessary. Chemicals which are known to etch III–V semiconductor materials or remove a group VI element include hydrofluoric acid, hydrochloric acid, ammonium hydroxide, and deionized water.

The discovery that dry etching of silicon nitride layer 12 with a chemical comprised of a group VI element adequately provides the group VI element at or near the surface of III–V semiconductor material 10 and that no additional steps that remove a group VI element or etch III–V semiconductor materials are performed after etching of silicon nitride layer 12 with a chemical comprised of a group VI element and before ohmic metal 17 is deposited is key to obtaining the benefits of the present invention.

Figure 3:
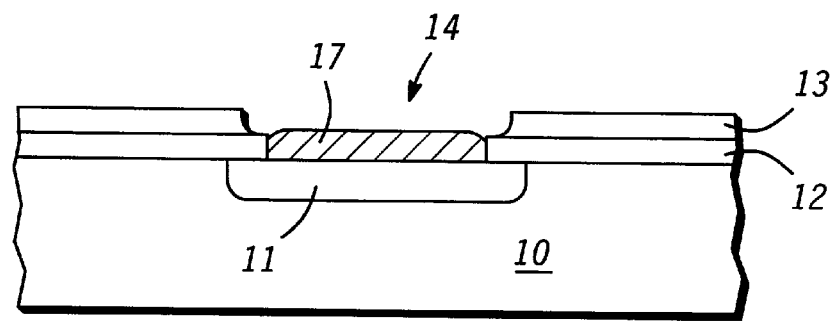
FIG. 3 illustrates an enlarged, cross-sectional view of an embodiment of the present invention in a subsequent stage of fabrication.

FIG. 3 illustrates the structure of FIG. 2 further along in processing. Masking layer 15 is removed, along with the portion of ohmic metal layer 17 overlying masking layer 15, using well known processes in the art so that a portion of ohmic metal layer 17 remains in contact with the surface of III–V semiconductor material 10. An anneal is performed to react ohmic metal layer 17 with III–V semiconductor material 10.

Although a lift-off process is shown to form ohmic metallization layer 17, an etched-ohmic-metal process may be used in the present invention as long as the ohmic metal layer is formed after etching of silicon nitride layer 12 with a chemical comprised of a group VI element and before exposure of the surface of III–V semiconductor material 10 to any other chemicals which remove a group VI element or etch the III–V semiconductor material 10.

As can be seen, a process for forming a low resistance ohmic metal contact to III–V semiconductor material is provided by the present invention. A dry etch of silicon nitride layer 12 using a chemical comprised of a group VI element enables the formation of a low resistance ohmic contact to III–V semiconductor material 10.

We claim:

1. A method of forming an ohmic contact, comprising the steps of:

providing a III–V semiconductor material;

forming a silicon nitride layer on the III–V semiconductor material;

forming a dielectric layer over the silicon nitride layer;

forming a masking layer over the dielectric layer;

removing a portion of the masking layer;

wet etching a portion of the dielectric layer such that the silicon nitride layer is not substantially etched;

dry etching a portion of the silicon nitride layer using a chemical comprised of a group VI element; and forming an ohmic metal layer on the III–V semiconductor material.

2. The method of claim 1 wherein the step of forming the ohmic metal layer comprises forming the ohmic metal layer after the step of dry etching a portion of the silicon nitride layer and before exposure of the III–V semiconductor material to a chemical which removes a group VI element or etches the III–V semiconductor material.

3. The method of claim 1 wherein the step of forming the ohmic metal layer comprises forming the ohmic metal layer after the step of dry etching a portion of the silicon nitride layer and before exposure of the III–V semiconductor material to hydrofluoric acid, hydrochloric acid, ammonium hydroxide, and deionized water.

4. The method of claim 1 wherein the step of wet etching the portion of the dielectric layer comprises wet etching the portion of the dielectric layer with a chemical comprised of hydrofluoric acid.

5. The method of claim 1 wherein the step of dry etching the portion of the silicon nitride layer comprises dry etching the portion of the silicon nitride layer with a chemical comprised of sulfur hexafluoride.

6. The method of claim 1 wherein the step of forming an ohmic metal layer comprises forming an ohmic metal layer comprised of a non-gold metal layer.

7. The method of claim 1 wherein the step of dry etching the portion of the silicon nitride layer comprises overetching the portion of the silicon nitride layer.

8. The method of claim 1 wherein the step of forming the dielectric layer comprises forming a silicon dioxide layer.

9. A method of forming an ohmic contact, comprising the steps of:

providing a III–V semiconductor material;

forming a silicon nitride layer on the III–V semiconductor material;

forming a dielectric layer over the silicon nitride layer;

forming a masking layer over the dielectric layer;

removing a portion of the masking layer;

wet etching a portion of the dielectric layer, such that the dielectric layer is undercut from the masking layer and the silicon nitride layer is not substantially etched;

dry etching a portion of the silicon nitride layer using a chemical comprised of a group VI element; and forming an ohmic metal layer on the III–V semiconductor material.

10. The method of claim 9 wherein the step of forming the ohmic metal layer comprises forming the ohmic metal layer after the step of dry etching and before exposure of the III–V semiconductor material to a chemical which removes a group VI element or etches the III–V semiconductor material.

11. The method of claim 9 wherein the step of forming the ohmic metal layer comprises forming the ohmic metal layer after the step of dry etching and before exposure of the III–V semiconductor material to a chemical which removes a group VI element or etches the III–V semiconductor material to hydrofluoric acid, hydrochloric acid, ammonium hydroxide, and deionized water.

12. The method of claim 9 wherein the step of forming the ohmic metal layer comprises forming the ohmic metal layer after the step of dry etching a portion of the silicon nitride layer and before exposure of the III–V semiconductor material to a chemical which removes a group VI element or etches the III–V semiconductor material.

13. The method of claim 9 wherein the step of dry etching the portion of the silicon nitride layer comprises dry etching the portion of the silicon nitride layer with a chemical comprised of sulfur hexafluoride.

14. The method of claim 9 wherein the step of dry etching the portion of the silicon nitride layer comprises overetching the portion of the silicon nitride layer.

15. A method of forming an ohmic contact to a III–V semiconductor material, comprising the steps of:

providing a III–V semiconductor material having a doped region formed therein;

forming a silicon nitride layer on the III–V semiconductor material over the doped region;

forming a silicon dioxide layer over the silicon nitride layer;

forming a masking layer over the silicon dioxide layer;

removing a portion of the masking layer;

wet etching a portion of the silicon dioxide layer, such that the silicon dioxide layer is undercut from the masking layer and the silicon nitride layer is not substantially etched;

dry etching a portion of the silicon nitride layer using a chemical comprised of sulfur hexafluoride; and forming an ohmic metal layer on the III–V semiconductor material over the doped region.

* * * * *